(12) United States Patent
Chung et al.

(10) Patent No.: US 12,457,905 B2
(45) Date of Patent: Oct. 28, 2025

(54) PATTERNING MAGNETIC TUNNEL JUNCTIONS AND THE LIKE WHILE REDUCING DETRIMENTAL RESPUTTERING OF UNDERLYING FEATURES

(71) Applicant: International Business Machines Corporation, Armonk, NY (US)

(72) Inventors: Kisup Chung, Slingerlands, NY (US); Michael Rizzolo, Albany, NY (US); Fee Li Lie, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/943,974

(22) Filed: Sep. 13, 2022

(65) Prior Publication Data

US 2023/0006131 A1  Jan. 5, 2023

Related U.S. Application Data

(62) Division of application No. 16/205,485, filed on Nov. 30, 2018, now Pat. No. 11,476,415.

(51) Int. Cl.
*H10B 61/00* (2023.01)
*H10N 50/01* (2023.01)
*H10N 50/10* (2023.01)
*H10N 50/80* (2023.01)

(52) U.S. Cl.
CPC ............. *H10N 50/01* (2023.02); *H10B 61/00* (2023.02); *H10N 50/10* (2023.02); *H10N 50/80* (2023.02)

(58) Field of Classification Search
CPC ........ H10B 61/00; H10N 50/01; H10N 50/10; H10N 50/80
See application file for complete search history.

(56) References Cited

U.S. PATENT DOCUMENTS

| | | | |
|---|---|---|---|
| 5,640,343 A | 6/1997 | Gallagher et al. |
| 6,358,756 B1 | 3/2002 | Sandhu |
| 6,521,931 B2 | 2/2003 | Sandhu et al. |
| 6,627,913 B2 | 9/2003 | Chen |

(Continued)

OTHER PUBLICATIONS

"Feature." Merriam-Webster.com. 2023. https://www.merriam-webster.com (Nov. 14, 2023) (Year: 2023).*

(Continued)

*Primary Examiner* — Reema Patel
(74) *Attorney, Agent, or Firm* — Yuanmin Cai; Otterstedt & Kammer PLLC

(57) ABSTRACT

Aspects of the invention are directed to a method of forming an integrated circuit. Both a dielectric layer and a bottom contact are formed with the bottom contact disposed at least partially in the dielectric layer. The bottom contact is subsequently recessed into the dielectric layer to cause the dielectric layer to define two sidewalls bordering regions of the bottom contact removed during recessing. Two sidewall spacers are then formed along the two sidewalls. A landing pad is formed on the recessed bottom contact and between the two sidewall spacers. Lastly, an additional feature is formed on top of the landing pad at least in part by anisotropic etching. In one or more embodiments, the additional feature includes a magnetic tunnel junction patterned at least in part by ion beam etching.

5 Claims, 12 Drawing Sheets

(56) References Cited

U.S. PATENT DOCUMENTS

| | | |
|---|---|---|
| 6,985,384 B2 | 1/2006 | Costrini |
| 7,220,601 B2 | 5/2007 | Hwang et al. |
| 7,241,632 B2 | 7/2007 | Yang |
| 7,397,099 B2 | 7/2008 | Hwang et al. |
| 7,537,709 B2 | 5/2009 | Cooper et al. |
| 7,544,983 B2 | 6/2009 | Yang |
| 8,021,966 B2 | 9/2011 | Jeong et al. |
| 8,105,948 B2 | 1/2012 | Zhong et al. |
| 8,802,451 B2 | 8/2014 | Malmhall et al. |
| 8,860,155 B2 | 10/2014 | Min-Hwa |
| 9,142,762 B1 | 9/2015 | Li |
| 9,166,154 B2 | 10/2015 | Satoh |
| 9,190,260 B1 | 11/2015 | Zhang et al. |
| 9,362,490 B1 | 6/2016 | Xiao |
| 9,660,179 B1 | 5/2017 | Annunziata |
| 9,705,071 B2 | 7/2017 | Annunziata |
| 9,767,860 B2 | 9/2017 | Castro et al. |
| 9,806,170 B1 | 10/2017 | Mulfinger |
| 9,818,935 B2 | 11/2017 | Chuang |
| 9,882,119 B2 | 1/2018 | Ozeki |
| 9,966,122 B2 | 5/2018 | Shirotori |
| 9,972,777 B1 | 5/2018 | Haq |
| 10,002,831 B2 | 6/2018 | Briggs et al. |
| 10,109,674 B2 | 10/2018 | Lu |
| 10,483,119 B1 | 11/2019 | Pan |
| 10,564,229 B2 | 2/2020 | Sasaki |
| 10,573,449 B2 | 2/2020 | Sasaki |
| 10,868,237 B2 | 12/2020 | Yang |
| 11,476,415 B2 | 10/2022 | Chung |
| 2003/0122175 A1 | 7/2003 | Buskirk |
| 2004/0229430 A1 | 11/2004 | Findeis |
| 2005/0041405 A1 | 2/2005 | Kawagoe |
| 2007/0120210 A1 | 5/2007 | Yuan |
| 2007/0173061 A1 | 7/2007 | Hong |
| 2010/0289098 A1 | 11/2010 | Li |
| 2011/0041330 A1 | 2/2011 | Kumar |
| 2013/0032775 A1 | 2/2013 | Satoh |
| 2015/0287910 A1 | 10/2015 | Lu |
| 2016/0225817 A1 | 8/2016 | Machkaoutsan |
| 2017/0352801 A1* | 12/2017 | Lee ............... H10B 61/22 |
| 2018/0175284 A1* | 6/2018 | Hsieh ............ H10N 50/10 |
| 2018/0211920 A1 | 7/2018 | Briggs |
| 2018/0226452 A1* | 8/2018 | Nam ............. H10B 61/22 |
| 2018/0261759 A1 | 9/2018 | Bhosale |
| 2018/0269385 A1 | 9/2018 | Iwata |
| 2018/0287051 A1 | 10/2018 | Bhosale |
| 2019/0043795 A1 | 2/2019 | Chen |
| 2019/0386210 A1 | 12/2019 | Rizzolo |
| 2020/0098982 A1 | 3/2020 | Chuang |
| 2020/0176673 A1 | 6/2020 | Chung |

OTHER PUBLICATIONS

Paul J. Otterstedt, List of IBM Patents or Patent Applications Treated as Related, Aug. 14, 2023 pp. 1-2.

* cited by examiner

PATTERNING MAGNETIC TUNNEL JUNCTIONS AND THE LIKE WHILE REDUCING DETRIMENTAL RESPUTTERING OF UNDERLYING FEATURES

CROSS-REFERENCE TO RELATED APPLICATION

This application is a division of U.S. patent application Ser. No. 16/205,485 filed Nov. 30, 2018, the complete disclosure of which is expressly incorporated herein by reference in its entirety for all purposes.

BACKGROUND

The present invention relates to the electrical, electronic, and computer arts, and, more particularly, to methods for utilizing sidewall spacer features to decrease the detrimental resputtering of underlying elements while forming magnetic tunnel junctions and the like.

Magnetic memory devices, such as magnetic random access memory (MRAM) devices, use magnetic memory cells to store information. Information is stored in a magnetic memory cell as the orientation of the magnetization of a free layer in the magnetic memory cell as compared to the orientation of the magnetization of a fixed or pinned layer in the same memory cell. The magnetization of the free layer may be oriented parallel or anti-parallel to the fixed layer, representing either a logic "0" or a logic "1." One type of memory cell utilizes a magnetic tunnel junction (MTJ) comprising a free layer and a fixed layer separated by a thin dielectric barrier (a tunnel barrier), which typically comprises aluminum oxide. The resistance of the memory cell depends on the direction of magnetization of the free layer relative to the direction of magnetization of the fixed layer. Thus, the state of the cell can be sensed by measuring its resistance. Current MRAM designs using MTJs to store data are non-volatile and have seemingly unlimited read and write endurance.

To allow reading and writing to an MTJ, an MTJ is typically sandwiched between two metal contacts: a bottom contact and a top contact. Formation of the MTJ is frequently via blanket deposition of the layers forming the MTJ, and then patterning to form discrete devices. Patterning often includes anisotropic ion beam etching (IBE) in combination with photolithography. However, because portions of the bottom contact are frequently exposed at the end of the IBE process, some resputtering of the metal bottom contact is commonplace. Resputtered metal can coat the just-formed MTJ, causing shorts and other issues with functionality. Such resputtering can be particularly problematic when design rule constraints demand that the bottom contact be significantly wider than the MTJ, causing large regions of the bottom contacts to be exposed to etching when patterning the MTJ.

SUMMARY

Embodiments of the invention provide methods and apparatus for decreasing detrimental resputtering of underlying features while patterning MTJs and the like.

Aspects of the invention are directed to a method of forming an integrated circuit. Both a dielectric layer and a bottom contact are formed with the bottom contact disposed at least partially in the dielectric layer. The bottom contact is subsequently recessed into the dielectric layer to cause the dielectric layer to define two sidewalls bordering regions of the bottom contact removed during recessing. Two sidewall spacers are then formed along the two sidewalls. A landing pad is formed on the recessed bottom contact and between the two sidewall spacers. Lastly, an additional feature is formed on top of the landing pad at least in part by anisotropic etching.

Additional aspects of the invention are directed to a semiconductor device formed using the method set forth in the previous paragraph.

Even additional aspects of the invention are directed to an integrated circuit. The integrated circuit comprises a dielectric layer, a bottom contact, two sidewall spacers, a landing pad, and an additional feature. The bottom contact is disposed at least partially in the dielectric layer. Both the two sidewall spacers and the landing pad are disposed on the bottom contact, with the landing pad further disposed between the two sidewall spacers. The additional feature is disposed on the landing pad.

BRIEF DESCRIPTION OF THE DRAWINGS

These and other features, aspects, and advantages of the present invention will become better understood with regard to the following description, appended claims, and accompanying drawings where:

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1:
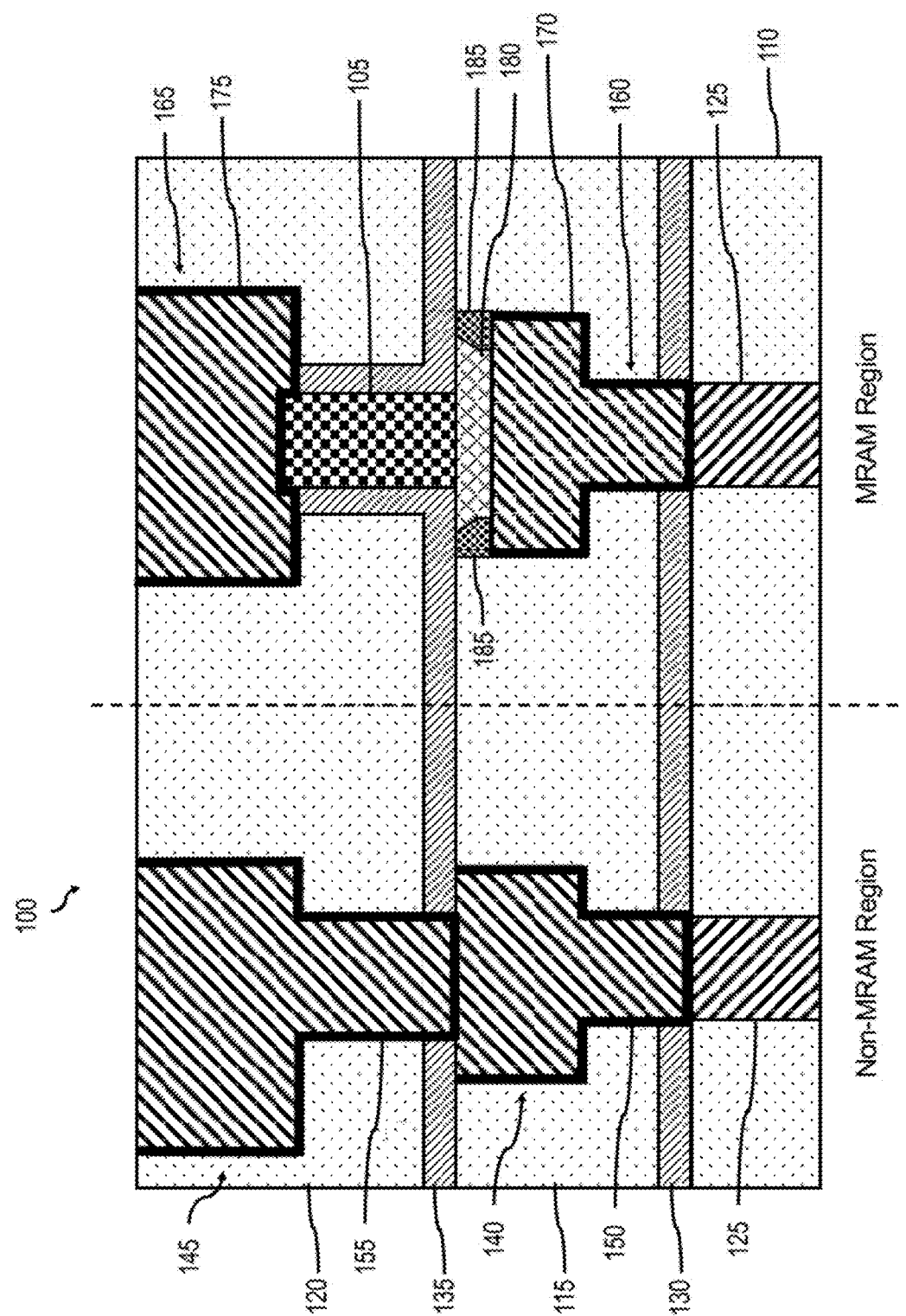
FIG. 1 shows a sectional view of a portion of a film stack in an integrated circuit, in accordance with an illustrative embodiment of the invention.

FIG. 1 shows a sectional view of a film stack 100 in an integrated circuit, in accordance with an illustrative embodiment of the invention. For purposes of illustration, the integrated circuit includes MRAM devices. The film stack includes an MTJ 105 in an "MRAM Region" (the right side of the sectional view), as well as a "Non-MRAM Region" (the left side of the sectional view) that is devoid of such a feature. The remainder of the sectional views provided herein each show a similar combination of both Regions.

Both the Non-MRAM and MRAM Regions of the film stack 100 include a lower dielectric layer 110, a middle dielectric layer 115, and an upper dielectric layer 120, which may constitute interlayer dielectrics (ILDs) in the integrated circuit. Lower interconnects 125 are disposed in the lower dielectric layer 110. In between the lower dielectric layer 110 and the middle dielectric layer 115, one finds a lower capping layer 130, and in between the middle dielectric layer 115 and the upper dielectric layer 120, one finds an upper capping layer 135. Beyond these common features, the Non-MRAM Region of the film stack includes a non-MRAM bottom contact 140 and a non-MRAM top contact 145. The non-MRAM bottom contact 140 includes a non-MRAM bottom contact liner 150, and the non-MRAM top contact 145 includes a non-MRAM top contact liner 155. The MRAM Region, in turn, comprises a MRAM bottom contact 160, the MTJ 105, and an MRAM top contact 165. Here, the MRAM bottom contact 160 includes a MRAM bottom contact liner 170, and the MRAM top contact 165 includes a MRAM top contact liner 175. Between the MRAM bottom contact 160 and the MTJ 105, a landing pad 180 exists between two sidewall spacers 185. The MTJ 105 directly contacts the landing pad 180 and the MRAM top contact 165. As the adverb "directly" is used herein and in the appended claims, it is intended to mean without any intervening elements.

Arranged as indicated in FIG. 1, the landing pad 180 forms a discrete element disposed on top of the MRAM bottom contact 160 and between the sidewall spacers 185. Because of the volume occupied by the sidewall spacers 185, the landing pad 180 is narrower than the top of the MRAM bottom contact 160. This narrowing of the landing pad 180 provides several advantages during processing, which will be further discussed below.

It is noted that the Regions shown in FIG. 1 will only constitute portions of an integrated circuit. Accordingly, when reduced to practice, a functional integrated circuity would include a myriad of additional features including, for example, transistors, interconnects, and the like. At the same time, the MTJ 105, while shown in the present figures as a homogeneous feature, will comprise a number of sublayers that are not explicitly shown herein solely for ease of presentation. These sublayers will already be familiar to one having ordinary skill in the relevant arts. Moreover, descriptions of the structure and functionality of MTJs, and MRAM devices more generally, are both readily available in the literature. An example includes U.S. Pat. No. 5,640,343 to Gallagher et al., entitled "Magnetic Memory Array Using Magnetic Tunnel Junction Devices in the Memory Cells," which is hereby incorporated by reference herein. Additional description is provided in, as just one more example, B. Dieny et al., *Introduction to Magnetic Random-Access Memory*, John Wiley & Sons, 2016, which is also hereby incorporated by reference herein.

Figure 2:
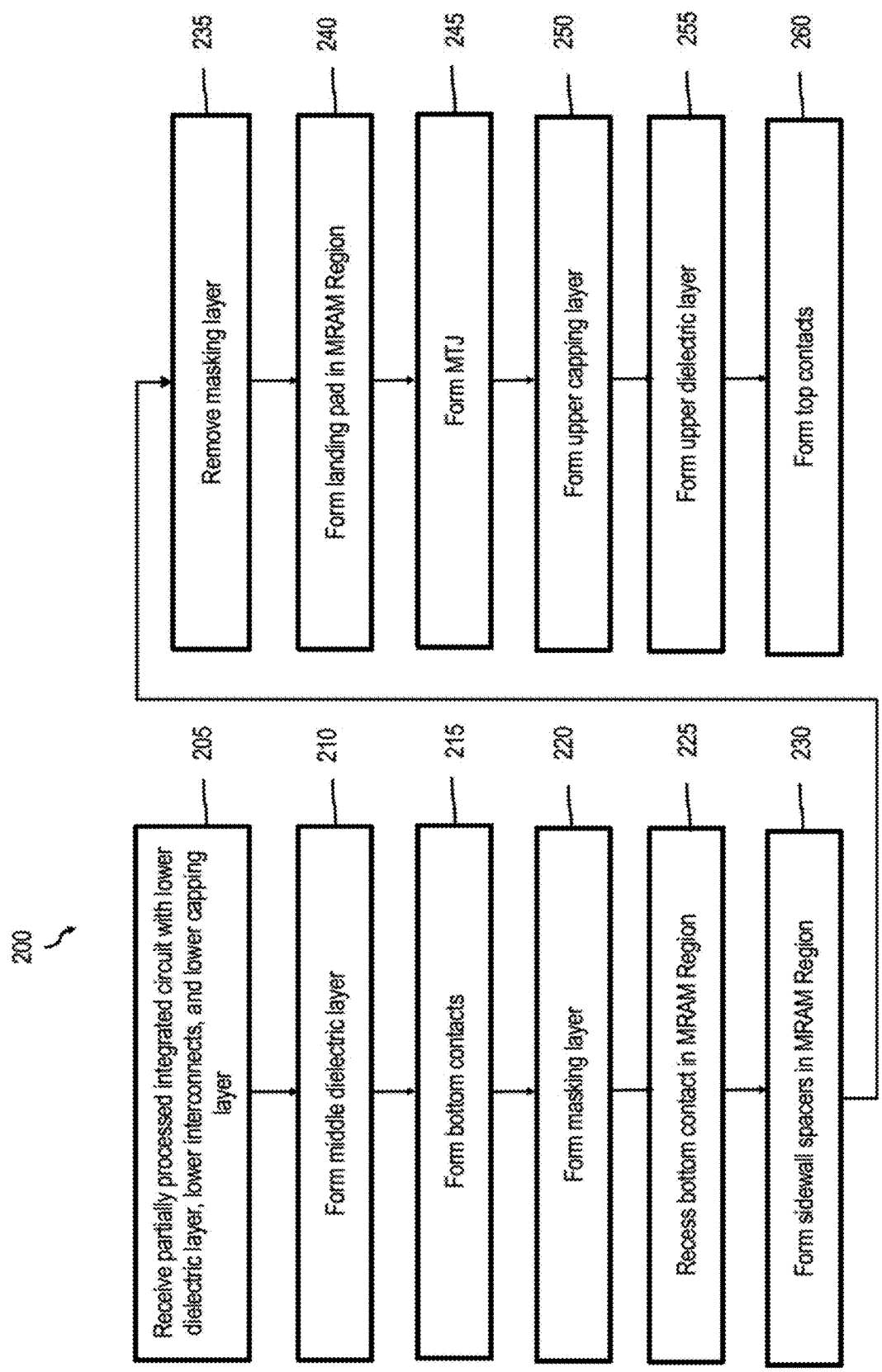
FIG. 2 shows a flow diagram of an illustrative method for forming the FIG. 1 film stack.

FIG. 2 shows a flow diagram of an illustrative method 200 for forming the film stack in FIG. 1. FIGS. 3-12 show sectional views of intermediate film stacks formed while performing the method 200. It is emphasized that, although the method 200 and the structures formed thereby are entirely novel, many of the individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications including, for example, P. V. Zant, *Microchip Fabrication, Sixth Edition: A Practical Guide to Semiconductor Processing*, McGraw Hill Professional, 2013; S. Wolf and R. N. Tauber, *Silicon Processing for the VLSI Era, Volume* 1, Lattice Press, 1986; and S. Wolf, *Silicon Processing for the VLSI Era, Vol. 4: Deep-Submicron Process Technology*, Lattice Press, 2003, all of which are hereby incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

Figure 3:
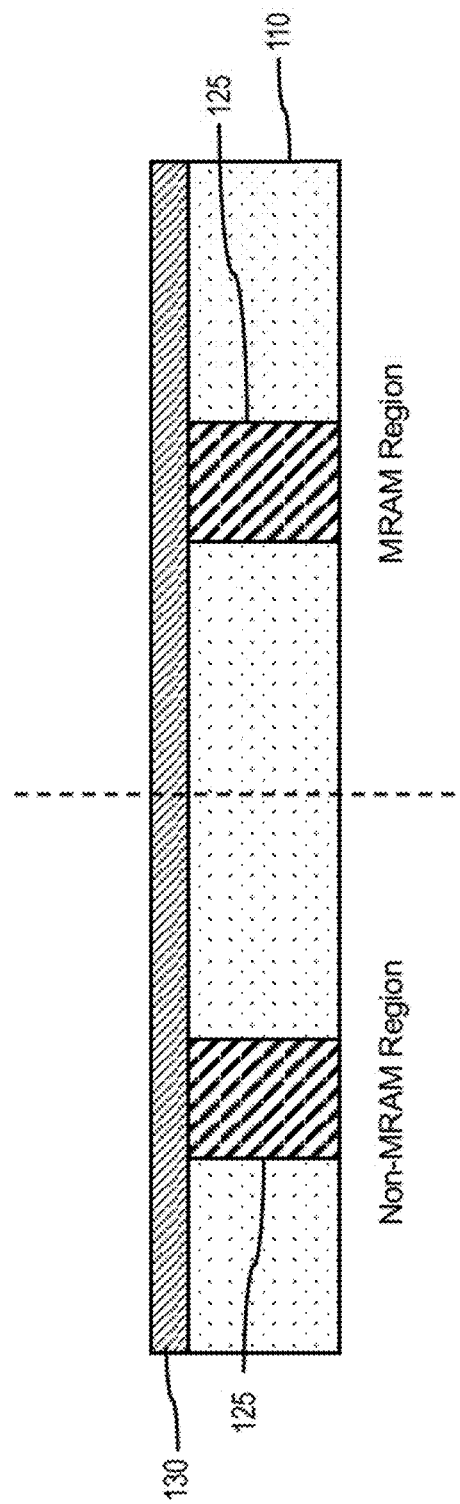
FIGS. 3-12 show sectional views of intermediate film stacks formed while performing the FIG. 2 method.

In step 205, a partially processed integrated circuit is received with the film stack shown in FIG. 3. At this point in the processing, it is assumed that the lower dielectric layer 110, lower interconnects 125, and lower capping layer 130 are already formed by front-end-of-line (FEOL), middle-of-line (MOL), and/or back-end-of-line (BEOL) processing in the manner shown in the figure. The lower dielectric layer 110 may comprise, for example, silicon oxide (including doped silicon oxide), while the lower interconnects 125 may comprise, for example, tungsten, aluminum, or copper. The lower capping layer 130 may comprise silicon nitride, silicon oxynitride, or nitrogen-doped silicon carbide. In providing these selections of materials, however, it is emphasized that any particular material provided herein is merely by way of example and is not intended to limit the scope of the invention unless expressly set forth as doing so.

Figure 4:
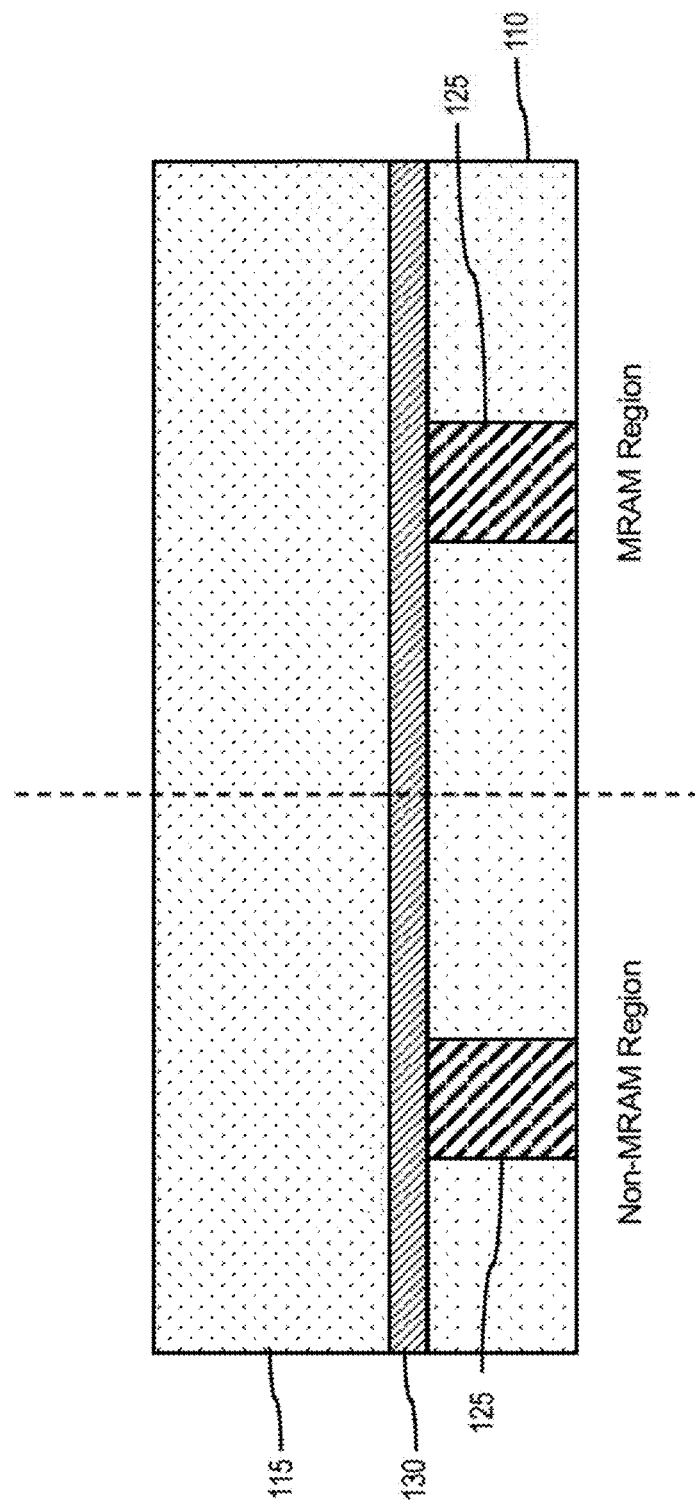

Next, in step 210, the middle dielectric layer 115 is formed to yield the film stack shown in FIG. 4. In one or more embodiments, the middle dielectric layer 115 may comprise silicon oxide. The middle dielectric layer 115 may be deposited by, for example, chemical vapor deposition (CVD), atomic layer deposition (ALD), or physical vapor deposition (PVD).

Figure 5:
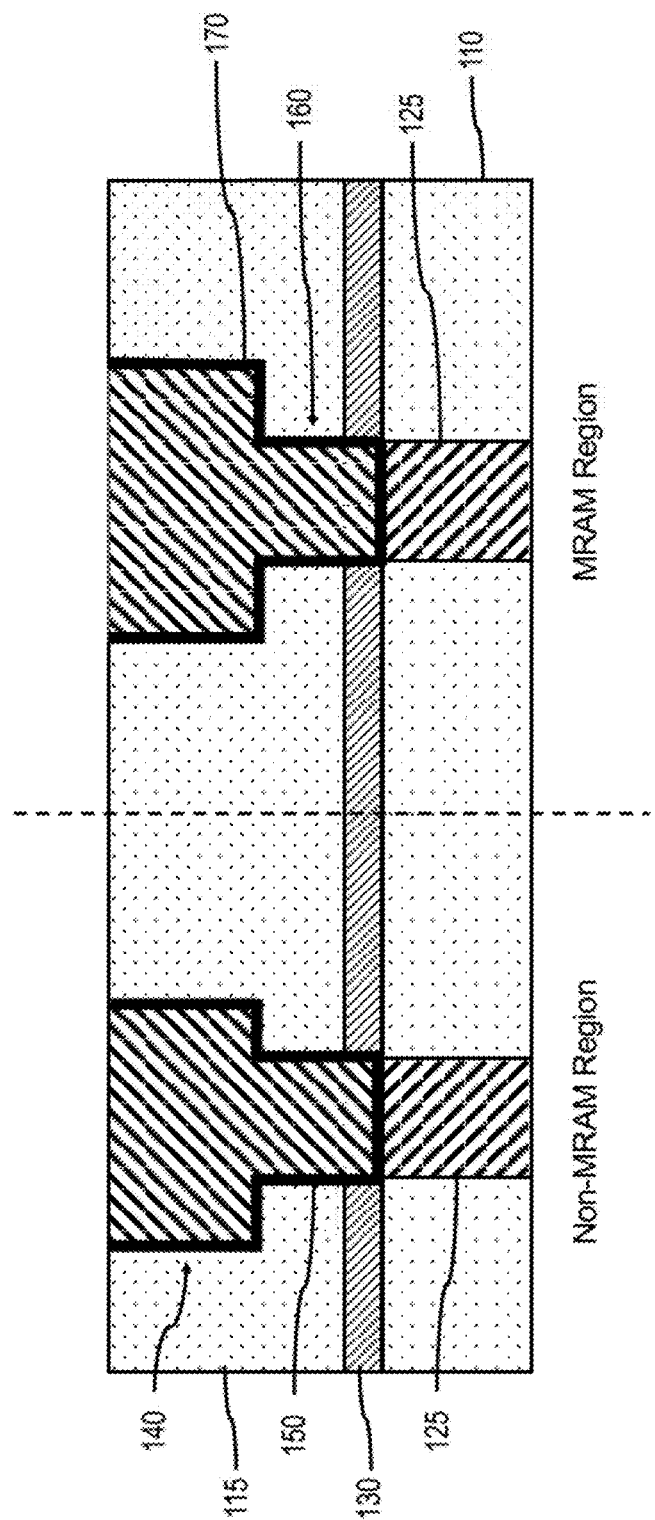
Figure 6:
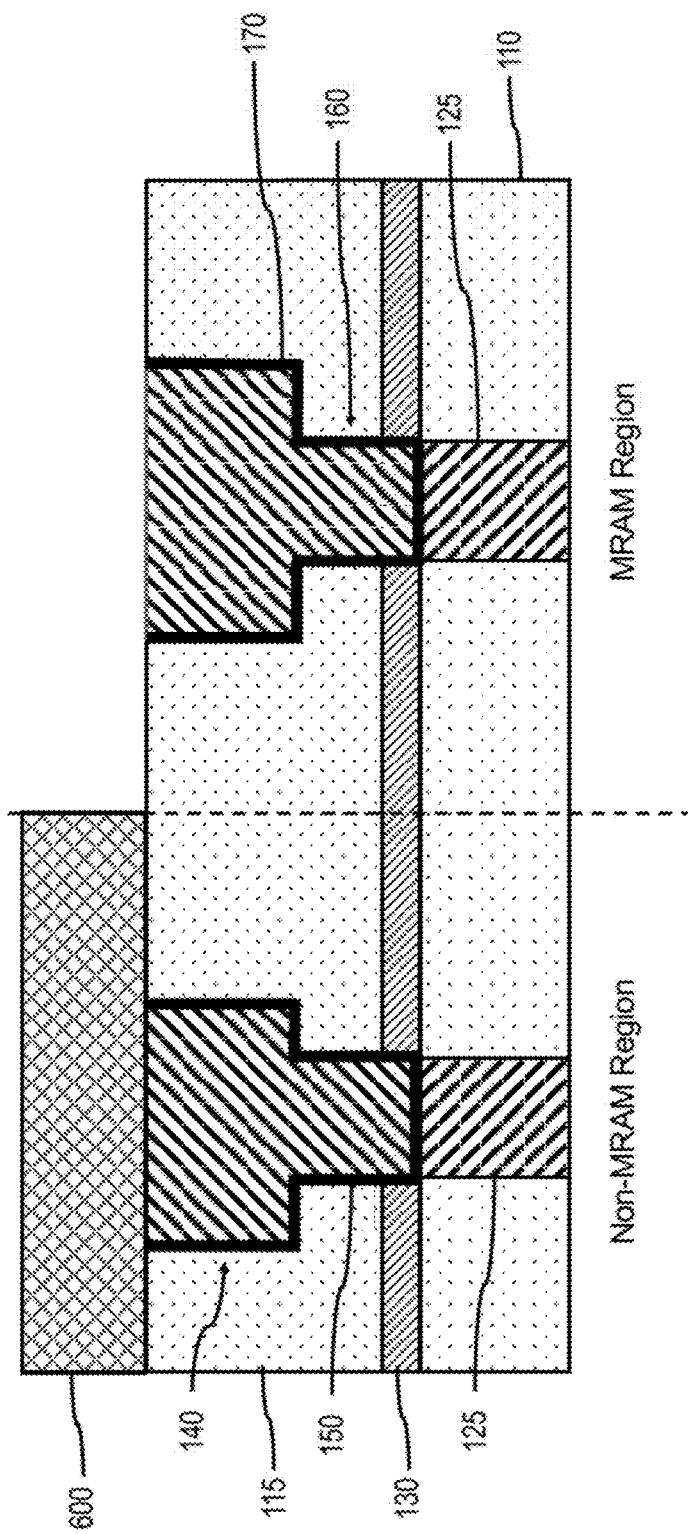

Subsequently, in step 215, the non-MRAM bottom contact 140 and the MRAM bottom contact 160 (with their respective liners 150, 170) are formed in the middle dielectric layer 115 to produce the film stack shown in FIG. 5. Formation may be by what is frequently called a damascene process (or "dual" damascene process). More particularly, formation may start with a first photolithography step and first reactive ion etching (RIE) step to define round vias that will create the vertical interconnects for the bottom contacts 140, 160. Next, a second photolithography step and a second RIE step may define the much larger trench portions that will create the horizontal metal wires for the bottom contacts 140, 160. Both RIE steps may be designed to, at least initially, selectively etch the middle dielectric layer 115 (e.g., silicon oxide) without etching, or only very slowly etching, the lower capping layer 130 (e.g., silicon nitride). In this manner, the lower capping layer 130 becomes a form of etch stop. A combination of $CHF_3$, $CF_4$, $CH_2F_2$, and Ar have been shown to selectively etch silicon oxide with a selectivity of oxide-to-nitride of about 30:1. With the etch stop exposed, the second RIE step may conclude with an etch chemistry that etches silicon nitride faster than silicon oxide so as to remove the exposed portions of the lower capping layer 130. A combination of $CH_2F_2$, $CH_3F$, $O_2$, F, and He has been shown to achieve a nitride-to-oxide selectivity of about 19:1.

Once the openings for the bottom contacts 140, 160 are so defined, the non-MRAM and MRAM bottom contact liners 150, 170 may be deposited, followed by deposition of the cores of the bottom contacts 140, 160. In one or more embodiments, the bottom contact liners 150, 170 may comprise, as just some examples, cobalt, ruthenium, tantalum, tantalum nitride, indium oxide, tungsten nitride, or titanium nitride, and the cores may comprise copper, cobalt, ruthenium, copper-manganese, or aluminum, with both the liners 150, 170 and cores deposited by CVD, PVD, and/or electroplating. When using copper for the metallization, tantalum/tantalum-nitride liners both aid with adhesion and inhibit the migration of copper into other portions of the integrated circuit. Excess metal outside the vias and trenches of the bottom contacts 140, 160 may then be removed by chemical mechanical polishing (CMP) to yield the film stack in FIG. 5.

Step 220 has the Non-MRAM Region of the integrated circuit masked off so that several of the next steps will occur solely in the MRAM Region. In the present non-limiting embodiment, the masking in step 220 is accomplished by forming a masking layer 600 overlying the Non-MRAM Region while leaving the MRAM Region exposed, providing the film stack shown in FIG. 6. While the masking layer 600 is shown as a homogeneous layer in the figures, the masking layer 600 may comprise a plurality of sublayers including one or more photoresist, antireflective, organic planarization layer (OPL), organic dielectric layer (ODL), and hard mask sublayers. Formation of the masking layer 600 may be via CVD followed by photolithography and RIE to remove the masking layer 600 over the MRAM Region while leaving it intact over the Non-MRAM Region.

Figure 7:
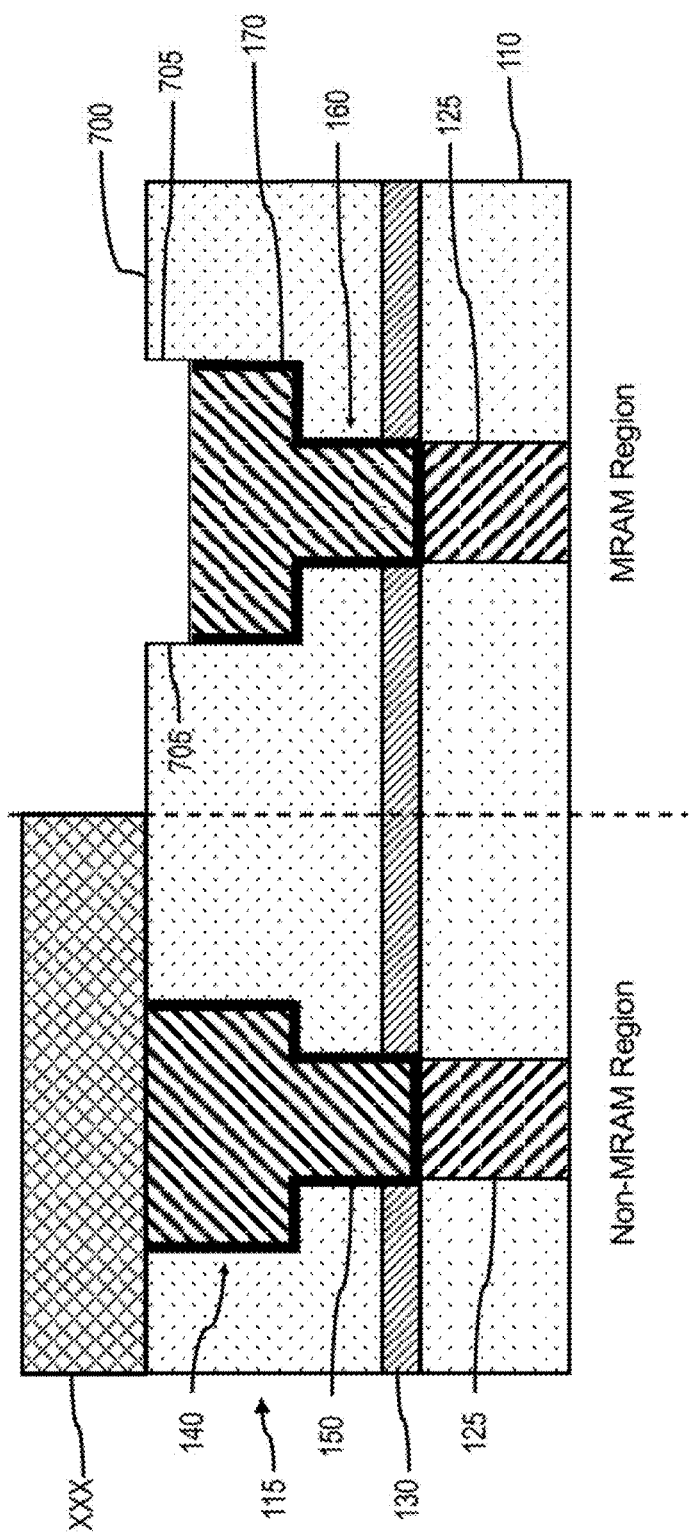

Step 225 involves recessing the MRAM bottom contact 160 below an upper surface 700 of the middle dielectric layer 115 to yield the film stack shown in FIG. 7. Recessing may be by wet chemical etching. If the MRAM bottom contact 160 (with its MRAM bottom contact liner 170) are formed of copper and tantalum/tantalum-nitride, for example, a solution comprising $H_2O_2$, $NH_4OH$, and CDTA (i.e., 1, 2-cyclohexane diaminetetraacetic acid) in $H_2O$ may be utilized to slowly and controllably recess the copper portion. Such a process is described in, for example, U.S. Pat. No. 7,537,709 to E. I. Cooper et al., entitled, "Method for Isotropic Etching of Copper," which is hereby incorporated by reference herein. Subsequently, a solution comprising $H_2O_2$, BTA, (benzotriazole), CDTA, and KOH in $H_2O$ may be utilized to recess the remaining tantalum/tantalum-nitride MRAM bottom contact liner 170. Here, such a process is described in, for example, U.S. Pat. No. 10,002,831 to B. D. Briggs et al., entitled "Selective and Non-selective Barrier Layer Wet Removal," which is also hereby incorporated by reference herein. In some embodiments, the copper and tantalum/tantalum-nitride wet etches may be combined. After such recessing, the middle dielectric layer 115 defines two sidewalls 705 bordering the region of the MRAM bottom contact just removed during recessing. These two sidewalls 705 are clearly evident in FIG. 7.

Figure 8:
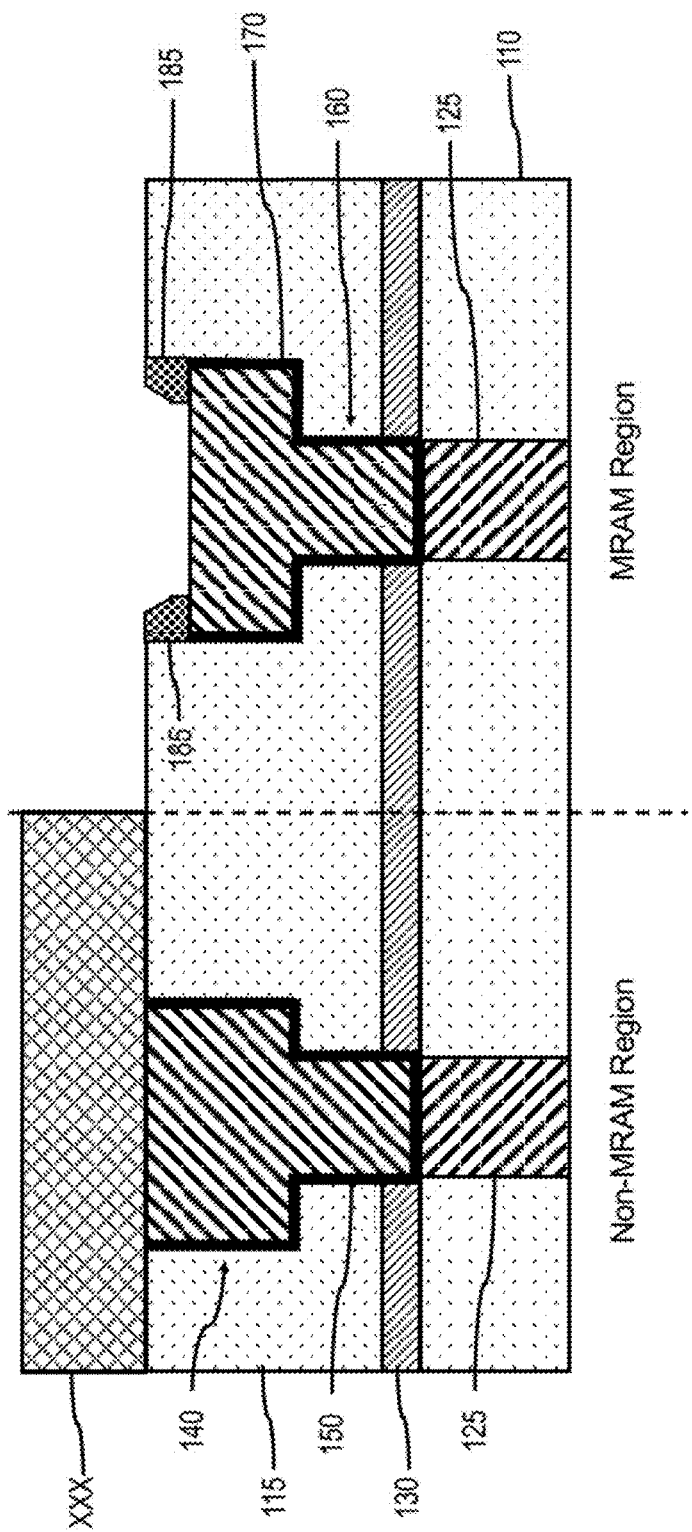
Figure 9:
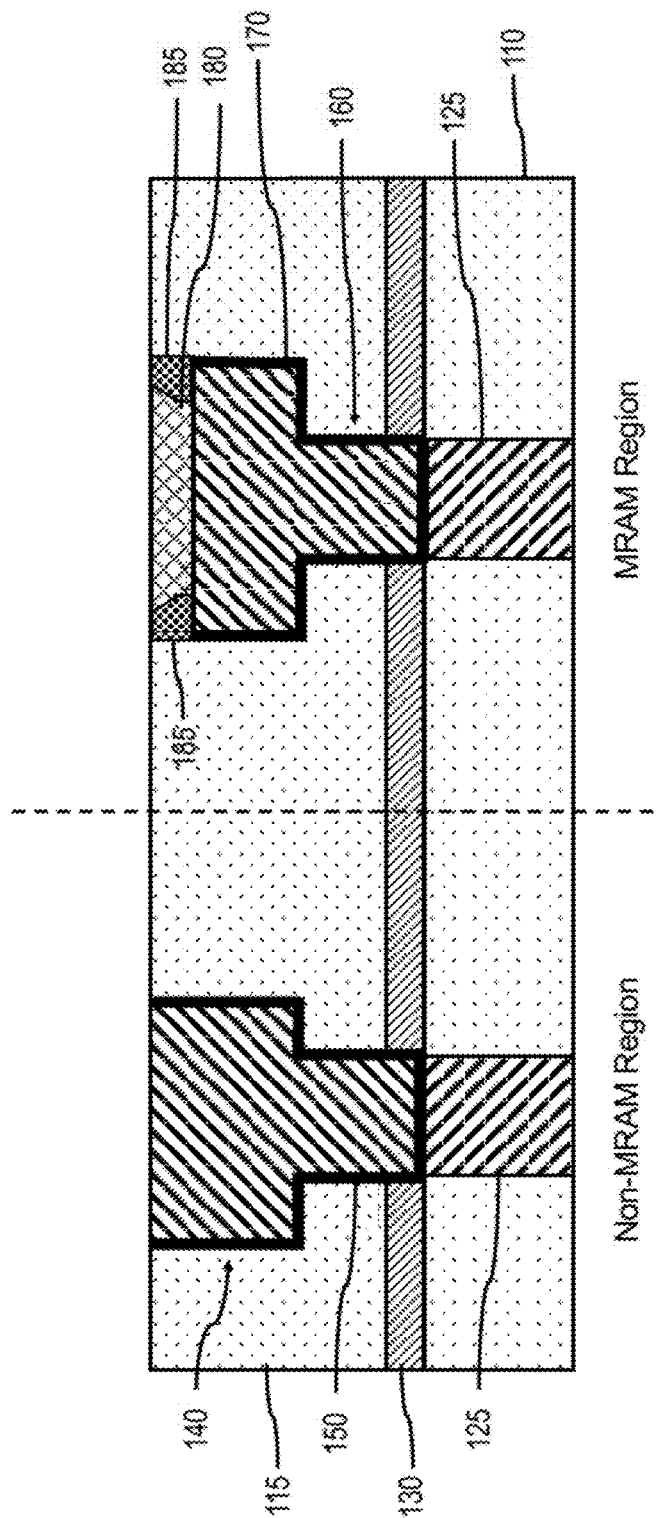

Step 230 involves forming the sidewall spacers 185 on the two sidewalls 705 of the middle dielectric layer 115 created in step 225 to create the film stack shown in FIG. 8. The sidewall spacers 185 may comprise, for example, a dielectric material such as silicon nitride, silicon oxynitride, or nitrogen-doped silicon carbide. Formation of the sidewall spacers may be by blanket deposition via CVD, ALD, or PVD, followed by RIE. The RIE, being anisotropic, removes the just deposited dielectric material on the horizontal surfaces while leaving the sidewall spacers along the vertical surfaces of the two sidewalls 705 of the middle dielectric layer 115.

Next, in step 235, the masking layer 600 is removed by, for example, wet etching. In step 240, the landing pad 180 is then formed on top of the MRAM bottom contact 160 and between the two sidewall spacers 185 to create the film stack shown in FIG. 9. In one or more embodiments, the landing pad 180 may comprise niobium, niobium nitride, tungsten, tungsten nitride, titanium, titanium nitride, ruthenium, molybdenum, or any other metal or metal nitride with relatively high melting points. CVD, ALD, PVD, or electroplating may be utilized to initially deposit a blanket layer of the landing pad material, and then CMP may be used to remove the excess material and leave the discrete landing pad 180 only in the recessed region of the MRAM bottom contact 160.

Figure 10:
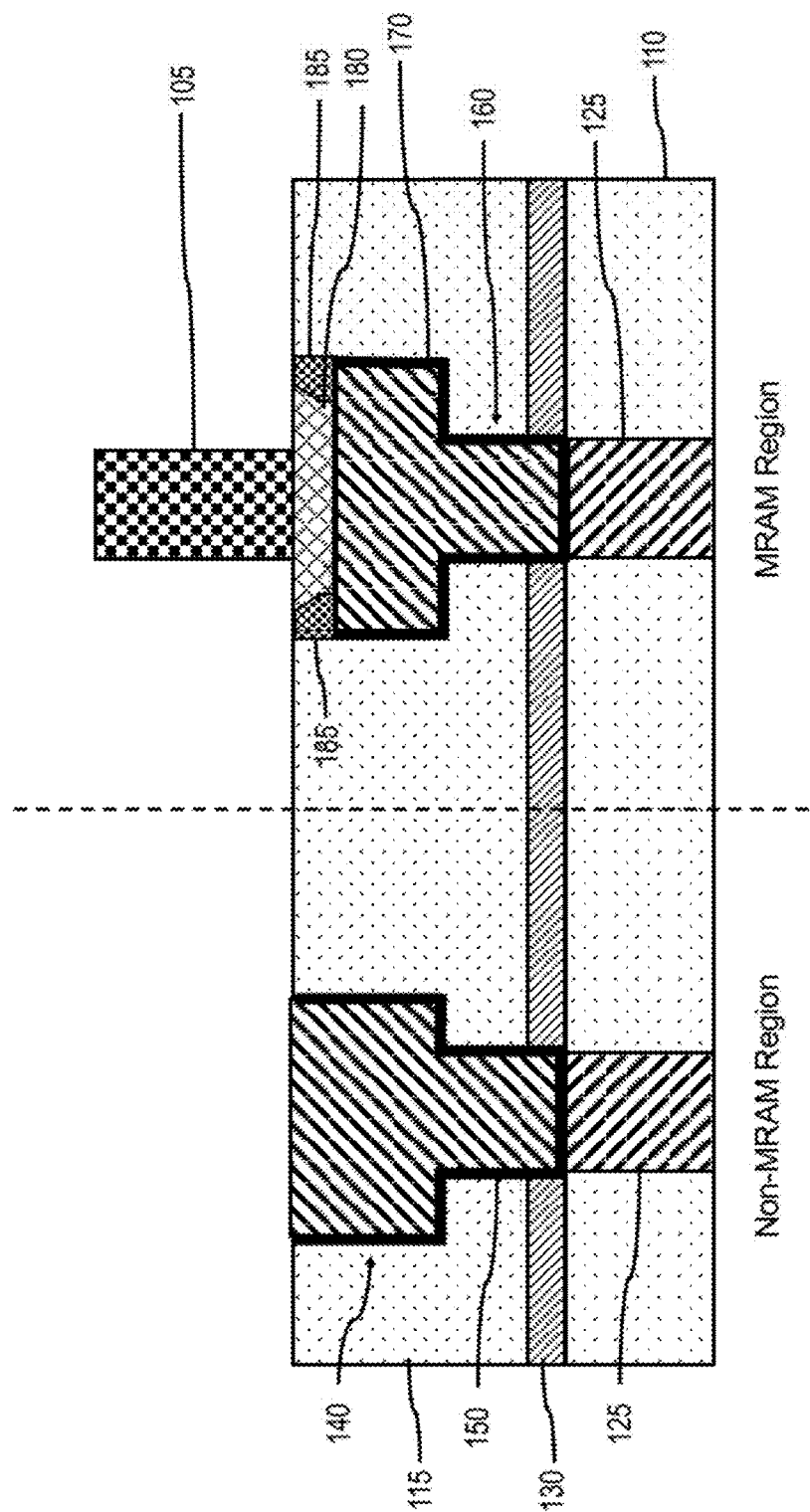
Figure 11:
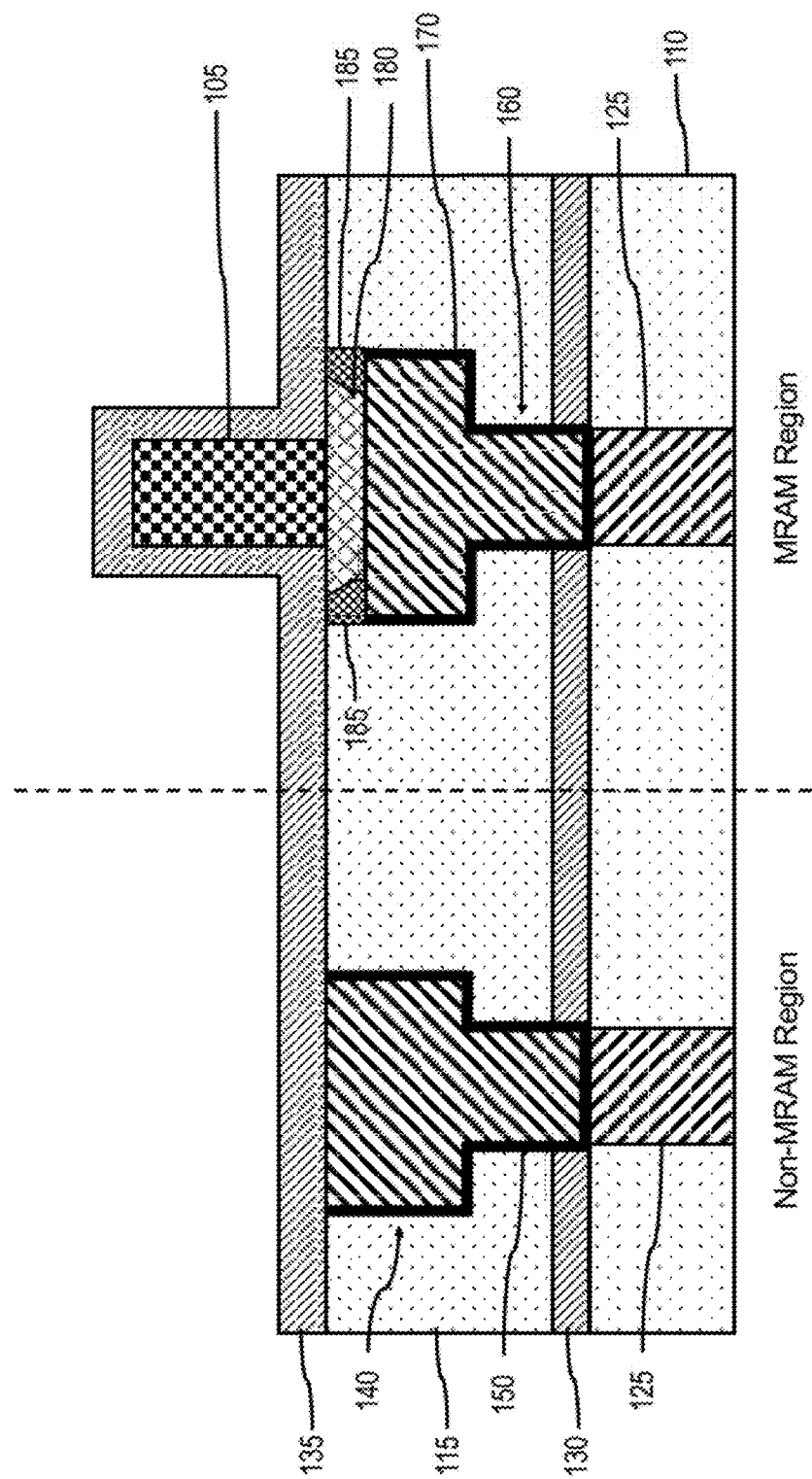
Figure 12:
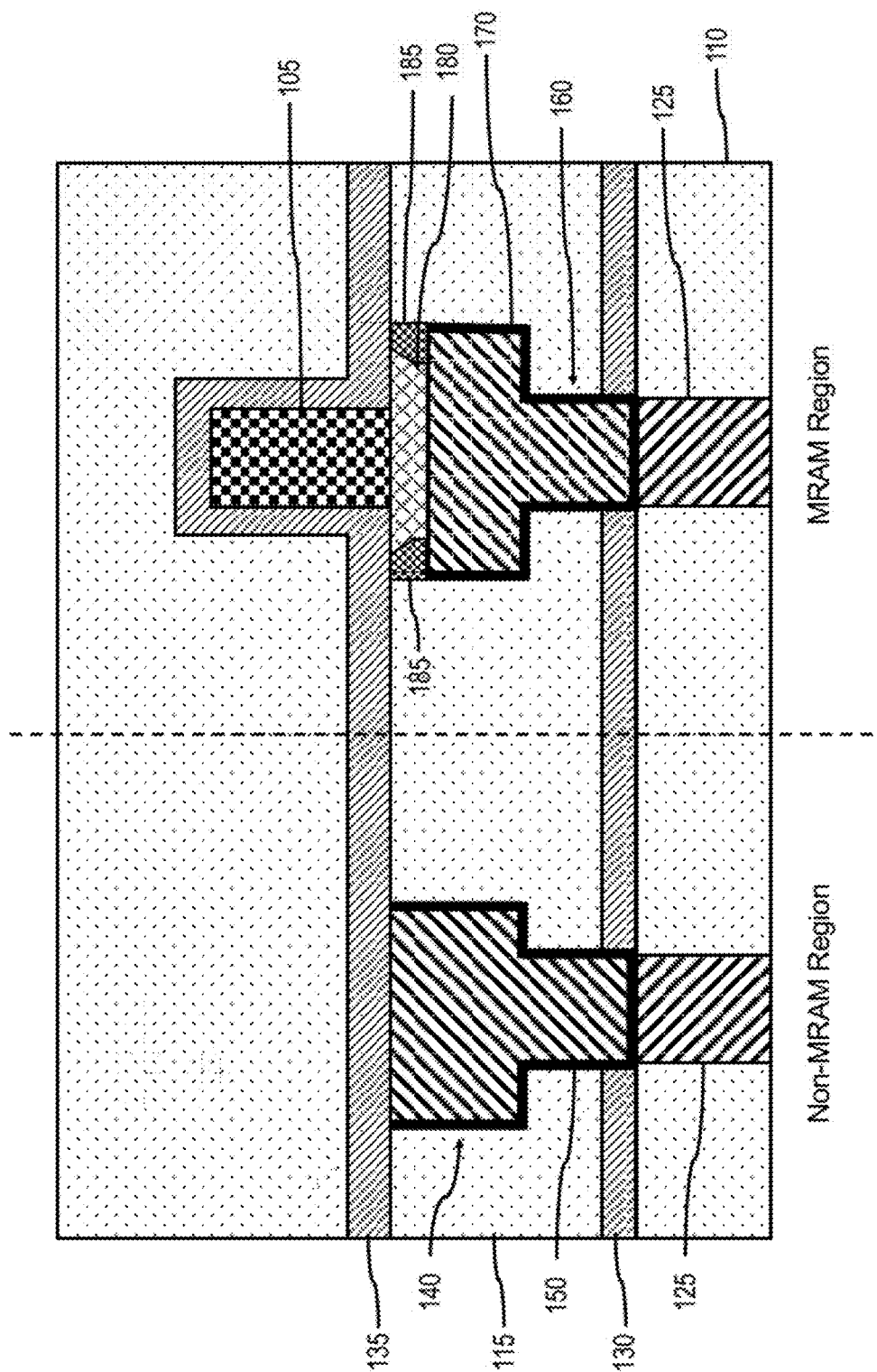

With the landing pad 180 so formed, the method 200 then moves on to forming the MTJ 105 and the remaining structures that appear in FIG. 1. In step 245, the MTJ 105 is formed by depositing the numerous sublayers that form the MTJ 105 by, for example, CVD, ALD, or PVD, and then utilizing photolithography and IBE to pattern the MTJ 105 into a discrete feature. The resultant film stack is shown in FIG. 10. Next, in step 250, the upper capping layer 135 is deposited to achieve the film stack shown in FIG. 11. Like the lower capping layer 130, the upper capping layer 135 may, in one or more embodiments, comprise conformal silicon nitride, silicon oxynitride, or nitrogen-doped silicon carbide formed by CVD, ALD, or PVD. With the upper capping layer 135 in place, the upper dielectric layer 120 is then formed in step 255 to yield the film stack shown in FIG. 12. The upper dielectric layer 120 may comprise, for example, two silicon oxide sublayers: a first silicon oxide sub-layer deposited by CVD, ALD, or PVD and planarized by CMP to a level corresponding to the top of the upper capping layer 135 overlying the MTJ 105, and then a second silicon oxide sublayer deposited by CVD, ALD, or PVD on the planarized first silicon oxide sublayer.

In one or more embodiments, patterning of the MTJ 105 in step 245 may occur by a self-aligned double patterning (SADP) process. SADP processing will already be familiar to one having ordinary skill in the relevant arts. Briefly, in SADP processing, spacer features are used as hard masks in combination with other masks to pattern features that are smaller than those can be easily created by photolithography alone. SADP processing is described in, for example, H. Geng, *Semiconductor Manufacturing Handbook, Second Edition,* McGraw Hill Professional, 2017, which is hereby incorporated by reference herein.

Lastly, in step 260, both the non-MRAM top contact 145 and the MRAM top contact 165 are formed in the upper dielectric layer 120 so that they contact the non-MRAM bottom contact 140 and the top of the MTJ 105, respectively. Formation may again be by a form of damascene processing. In the non-MRAM Region, first photolithography and RIE steps may be utilized to form the via portion of the non-MRAM top contact 145. RIE may utilize an etch chemistry selective to silicon oxide like that described above for step 215 so as to allow the upper capping layer 135 to act as an etch stop. Next, second photolithography and RIE steps may be utilized to form the trench portions of both the non-MRAM top contact 145 and the MRAM top contact 165. The RIE may start with a process selective to silicon oxide, but then switch over to a RIE process that effectively etches silicon nitride to remove the now-exposed portions of the upper capping layer 135 overlying the non-MRAM bottom contact 140 and the MTJ 105. Once the vias/trenches of the top contacts 145, 165, are formed in this manner, the top contacts may be completed by depositing the non-MRAM and MRAM top contact liners 155, 175 (e.g., cobalt, ruthenium, tantalum, tantalum nitride, indium, indium oxide, tungsten, and/or tungsten nitride) and the metal cores (e.g., copper, cobalt, ruthenium, copper-manganese, and/or aluminum) by CVD, ALD, PVD, and/or electroplating, again, in a manner similar to that described above for step 215. CMP may then be utilized to remove the excess metal from any horizontal surfaces. The resultant film stack is that shown in FIG. 1.

There are several process and design constraints when forming integrated circuits that include MTJs. An MTJ typically must: 1) land on a highly conductive feature (i.e., a bottom contact); and 2) must be patterned by some form of anisotropic etching process, most commonly IBE, which has little selectivity for different materials (i.e., essentially etches anything). At the same time, the critical dimensions (CDs) of bottom contacts are often set by patterning constraints such that the bottom contacts are quite large in comparison to MTJs. When using SADP processes to form the MTJs, for example, the lower contacts may have CDs that are several multiples of the CDs of the MTJs. Accordingly, when using conventional process flows, significant portions of the bottom contacts are exposed at the end of the MTJ etching process, and some resputtering of the bottom contacts is likely. Resputtered metal (e.g., copper) can coat the just-formed MTJs, causing shorts and other issues with functionality.

In the illustrative method set forth above, however, rather than having the top of the MRAM bottom contact 160 be exposed to the patterning of the MTJ 105, the top of the MRAM bottom contact 160 is instead replaced by a substantially narrower landing pad 180 that can violate the CD constraints for the bottom contact 160. That is, the maximum width of the landing pad 180 is smaller than the maximum width of the MRAM bottom contact 160 at the interface between the two features. As a result, most of the etching of the MTJ 105 falls on the newly introduced sidewalls spacers 185 rather than on a metallic feature. The sidewall spacers 185, being formed of a dielectric material (e.g., silicon nitride), are less likely than a metallic feature to cause serious defects if resputtered. The above-described illustrative embodiment, and more generally, embodiments falling within the scope of the invention, thereby provide means by which to pattern MTJs while reducing detrimental resputtering of underlying features, even when forming MTJs by SADP.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

Therefore, a method in accordance with an illustrative embodiment of the invention for forming an integrated circuit comprises forming both a dielectric layer (i.e., middle dielectric layer 115) and a bottom contact (i.e., MRAM bottom contact 160) disposed at least partially in the dielectric layer. The bottom contact is subsequently recessed into the dielectric layer to cause the dielectric layer to define two sidewalls (i.e., sidewalls 705) bordering regions of the bottom contact removed during recessing. Two sidewall spacers (i.e., sidewall spacers 185) are then formed along the two sidewalls. A landing pad (i.e., landing pad 180) is formed on the recessed bottom contact and between the two sidewall spacers. Finally, an additional feature (i.e., MTJ 105) is formed on top of the landing pad at least in part by anisotropic etching.

In another illustrative embodiment of the invention, a semiconductor device is formed at least in part by forming both a dielectric layer (i.e., middle dielectric layer 115) and a bottom contact (i.e., MRAM bottom contact 160) disposed at least partially in the dielectric layer. The bottom contact is subsequently recessed into the dielectric layer to cause the dielectric layer to define two sidewalls (i.e., sidewalls 705) bordering regions of the bottom contact removed during recessing. Two sidewall spacers (i.e., sidewall spacers 185) are then formed along the two sidewalls. A landing pad (i.e., landing pad 180) is formed on the recessed bottom contact and between the two sidewall spacers. An additional feature (i.e., MTJ 105) is formed on top of the landing pad at least in part by anisotropic etching.

Lastly, in even another illustrative embodiment of the invention, an integrated circuit comprises a dielectric layer (i.e., middle dielectric layer 115), a bottom contact (i.e., MRAM bottom contact 160), two sidewall spacers (i.e., sidewall spacers 185), a landing pad (i.e., landing pad 180), and an additional feature (i.e., MTJ 105). The bottom contact is disposed at least partially in the dielectric layer. Both the two sidewall spacers and the landing pad are disposed on the bottom contact, with the landing pad further disposed between the two sidewall spacers. The additional feature is disposed on the landing pad.

It should again be emphasized that the above-described embodiments of the invention are intended to be illustrative only. Other embodiments may, for example, utilize different materials and processing steps from those expressly set forth above to achieve embodiments falling within the scope of the invention. The spirit and scope of the appended claims should not be limited solely to the description of the preferred embodiments contained herein.

For example, while the above-described embodiments were directed at a film stack containing MTJ, aspects of the invention may also be applicable to other film stacks wherein a feature lands on a landing pad of some kind and resputtering of the landing pad is of concern while patterning the feature. In those other film stacks, the landing pad may also be narrowed in a manner similar to that described above using sidewalls spacers, thus reducing the landing pad's exposure to anisotropic etching and ameliorating any issues with resputtering. Such a processing strategy is of particular utility when forming the feature by a SADP process.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U. S.C. § 112(f).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit comprising:
   a dielectric layer;
   a bottom contact disposed at least partially in the dielectric layer, the bottom contact having an upper surface;
   two dielectric sidewall spacers disposed on the bottom contact;
   a landing pad disposed on the bottom contact and between the two dielectric sidewall spacers, wherein a maximum width of the landing pad at a top surface of the landing pad is smaller than a width of the bottom contact at an interface between the landing pad and the bottom contact; and
   a magnetic tunnel junction disposed directly on top of the landing pad;
   wherein the upper surface of the bottom contact is wider than the magnetic tunnel junction; and
   wherein:
      the landing pad is separately formed on the upper surface of the bottom contact;
      the landing pad is formed from a landing pad material selected from the group consisting of niobium, niobium nitride, tungsten, tungsten nitride, titanium, titanium nitride, ruthenium, and molybdenum;
      the bottom contact includes a bottom contact liner and a bottom contact core, wherein the bottom contact core is formed from a bottom contact core material selected from the group consisting of copper, cobalt, ruthenium, copper-manganese, and aluminum; and
      the upper surface of the bottom contact bottom contact has an equal width as does the landing pad plus the dielectric sidewall spacers.

2. An integrated circuit comprising:
   a middle dielectric layer;
   a bottom contact disposed at least partially in the dielectric layer, the bottom contact having an upper surface;
   two dielectric sidewall spacers disposed on the bottom contact;
   a landing pad disposed on the bottom contact and between the two dielectric sidewall spacers, wherein a maximum width of the landing pad at a top surface of the landing pad is smaller than a width of the bottom contact at an interface between the landing pad and the bottom contact;
   a magnetic tunnel junction disposed directly on top of the landing pad;
   a lower dielectric layer under the middle dielectric layer;
   a lower interconnect in the lower dielectric layer and electrically interconnected with the bottom contact;
   a lower capping layer between the lower dielectric layer and the middle dielectric layer;
   an upper dielectric layer above the middle dielectric layer;
   an upper capping layer between the middle dielectric layer and the upper dielectric layer and extending up sides of the magnetic tunnel junction; and
   a top contact electrically interconnected with the magnetic tunnel junction and at least partially in the upper dielectric layer.

3. The integrated circuit of claim 2, wherein the bottom contact comprises a round via and a horizontal metal wire above the round via, wherein the horizontal metal wire is wider than the round via when viewed in cross section and wherein the width of the bottom contact at the interface between the landing pad and the bottom contact is the width of the horizontal metal wire.

4. The integrated circuit of claim 3, wherein:
   the sidewall spacers are formed from a sidewall spacer material selected from the group consisting of silicon nitride, silicon oxynitride, and nitrogen-doped silicon carbide;
   the landing pad is formed from a landing pad material selected from the group consisting of niobium, niobium nitride, tungsten, tungsten nitride, titanium, titanium nitride, ruthenium, and molybdenum;
   the lower capping layer is formed from a lower capping layer material selected from the group consisting of conformal silicon nitride, silicon oxynitride, or nitrogen-doped silicon carbide; and
   the upper capping layer is formed from an upper capping layer material selected from the group consisting of conformal silicon nitride, silicon oxynitride, or nitrogen-doped silicon carbide.

5. The integrated circuit of claim 3, wherein:
   the bottom contact, the two dielectric sidewall spacers, the landing pad, the magnetic tunnel junction, the lower interconnect, and the top contact are located in a magnetic random access memory (MRAM) region; and
   the lower dielectric layer, the lower capping layer, the middle dielectric layer, the upper capping layer, and the upper dielectric layer extend horizontally from the magnetic random access memory (MRAM) region into a non-magnetic random access memory (non-MRAM) region;
   further comprising:
      a non-MRAM lower interconnect located in the lower dielectric layer in the non-magnetic random access memory (non-MRAM) region;
      a non-MRAM bottom contact located partially in the middle dielectric layer in the non-magnetic random access memory (non-MRAM) region and extending through the lower capping layer in the non-magnetic random access memory (non-MRAM) region to contact the non-MRAM lower interconnect; and
      a non-MRAM top contact located partially in the upper dielectric layer in the non-magnetic random access memory (non-MRAM) region and extending through the upper capping layer in the non-magnetic random access memory (non-MRAM) region to contact the non-MRAM bottom contact.

* * * * *